United States Patent
Yang et al.

(10) Patent No.: US 8,039,966 B2
(45) Date of Patent: Oct. 18, 2011

(54) STRUCTURES OF AND METHODS AND TOOLS FOR FORMING IN-SITU METALLIC/DIELECTRIC CAPS FOR INTERCONNECTS

(75) Inventors: Chih-Chao Yang, Albany, NY (US); Chao-Kun Hu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 12/553,265

(22) Filed: Sep. 3, 2009

(65) Prior Publication Data
US 2011/0049716 A1 Mar. 3, 2011

(51) Int. Cl.
*H01L 29/40* (2006.01)
(52) U.S. Cl. ........ 257/773; 438/680; 438/686; 438/641; 438/643; 438/674; 438/675; 438/676; 438/677; 438/687; 257/751; 257/E21.584; 257/E23.141; 257/E21.106; 257/E23.01; 257/E23.162; 118/719
(58) Field of Classification Search .......... None
See application file for complete search history.

(56) References Cited

U.S. PATENT DOCUMENTS

| | | | |
|---|---|---|---|
| 5,492,854 A * | 2/1996 | Ando | 438/396 |
| 5,585,673 A | 12/1996 | Joshi et al. | |
| 5,695,810 A | 12/1997 | Dubin et al. | |
| 6,323,554 B1 | 11/2001 | Joshi et al. | |
| 6,342,733 B1 | 1/2002 | Hu et al. | |
| 6,706,625 B1 | 3/2004 | Sudijono et al. | |
| 6,821,890 B2 * | 11/2004 | McGahay et al. | 438/687 |
| 7,396,759 B1 * | 7/2008 | van Schravendijk et al. | 438/625 |
| 7,576,006 B1 * | 8/2009 | Yu et al. | 438/687 |
| 2004/0113279 A1 | 6/2004 | Chen et al. | |
| 2005/0001325 A1 * | 1/2005 | Andricacos et al. | 257/762 |
| 2007/0063348 A1 * | 3/2007 | Yang et al. | 257/751 |

* cited by examiner

*Primary Examiner* — Charles Garber
*Assistant Examiner* — Yasser Abdelaziez
(74) *Attorney, Agent, or Firm* — Schmeiser, Olsen & Watts; Louis J. Percello

(57) ABSTRACT

A structure, tool and method for forming in-situ metallic/dielectric caps for interconnects. The method includes forming wire embedded in a dielectric layer on a semiconductor substrate, the wire comprising a copper core and an electrically conductive liner on sidewalls and a bottom of the copper core, a top surface of the wire coplanar with a top surface of the dielectric layer; forming a metal cap on an entire top surface of the copper core; without exposing the substrate to oxygen, forming a dielectric cap over the metal cap, any exposed portions of the liner, and the dielectric layer; and wherein the dielectric cap is an oxygen diffusion barrier and contains no oxygen atoms.

26 Claims, 9 Drawing Sheets

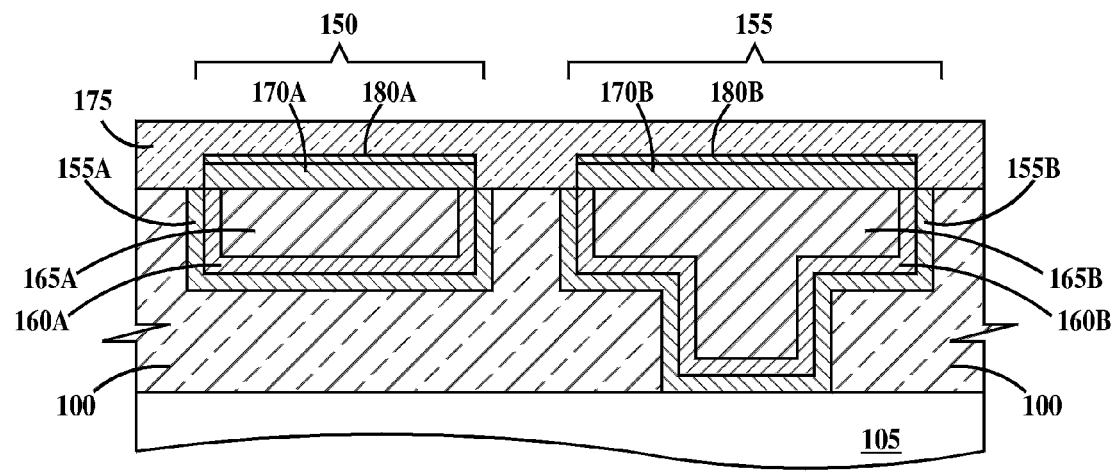
*FIG. 3D*
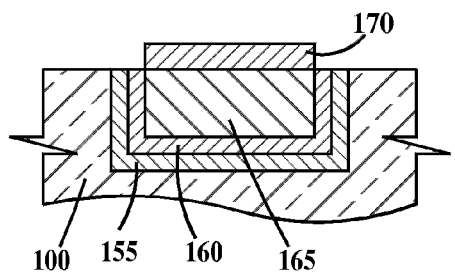 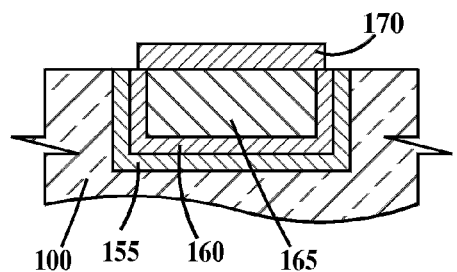
*FIG. 4A*  *FIG. 4B*
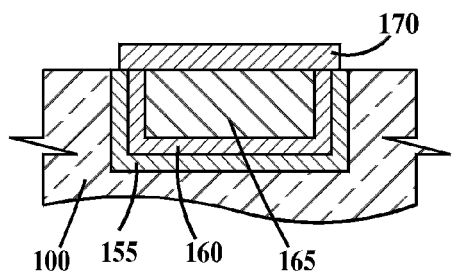 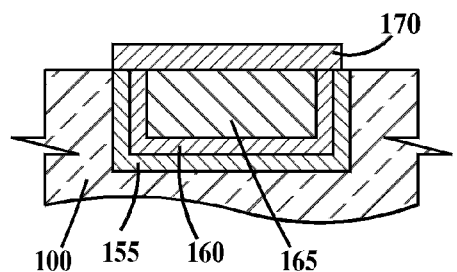
*FIG. 4C*  *FIG. 4D*

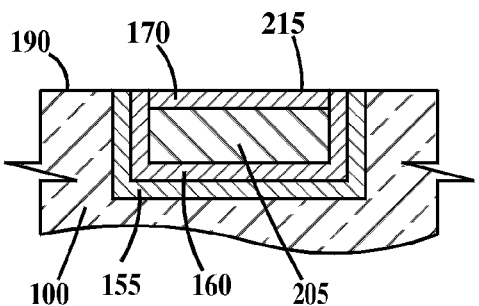
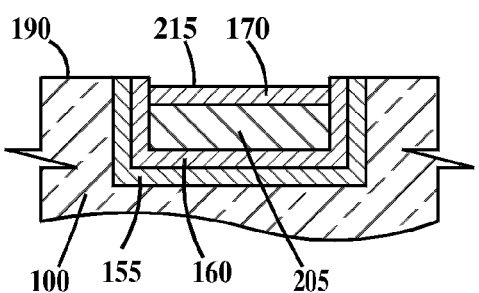
*FIG. 6A*  *FIG. 6B*
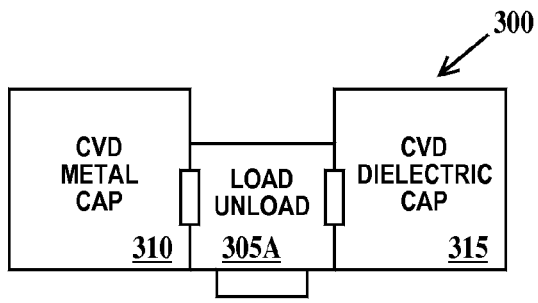
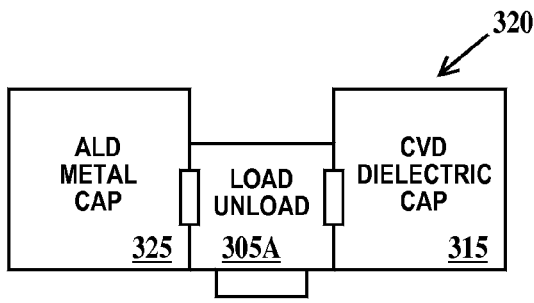
*FIG. 7A*  *FIG. 7B*
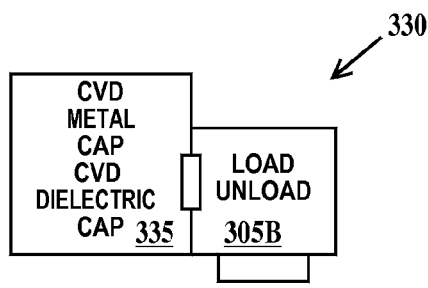
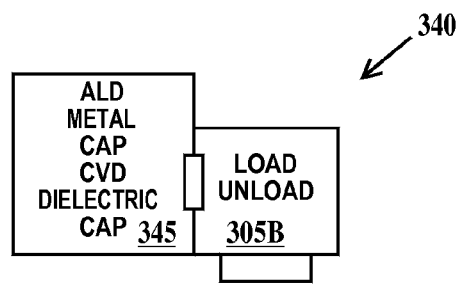
*FIG. 7C*  *FIG. 7D*

STRUCTURES OF AND METHODS AND TOOLS FOR FORMING IN-SITU METALLIC/DIELECTRIC CAPS FOR INTERCONNECTS

FIELD OF THE INVENTION

The present invention relates to the field of copper interconnection technology; more specifically the present invention relates to structures of in-situ metallic/dielectric caps, methods of fabricating in-situ metallic/dielectric caps and tools for forming in-situ metallic/dielectric caps for interconnects.

BACKGROUND

Current capping methods suffer from increased electromigration failures as the dimensions of the interconnect structures decrease and/or interconnect corrosion. Accordingly, there exists a need in the art to mitigate the deficiencies and limitations described hereinabove.

SUMMARY

A first aspect of the present invention is a method comprising: (a) forming wire embedded in a dielectric layer on a semiconductor substrate, the wire comprising a copper core and an electrically conductive liner on sidewalls and a bottom of the copper core, a top surface of the wire coplanar with a top surface of the dielectric layer; (b) forming a metal cap on an entire top surface of the copper core; (c) without exposing the substrate to oxygen, forming a dielectric cap over the metal cap, any exposed portions of the liner, and the dielectric layer; and wherein the dielectric cap is an oxygen diffusion barrier and contains no oxygen atoms.

A second aspect of the present invention is a structure, comprising: a wire embedded in a dielectric layer on a semiconductor substrate, the wire comprising a copper core and an electrically conductive liner on sidewalls and a bottom of the copper core, the copper core and the electrically conductive liner exposed at a top surface of the dielectric layer; a metal cap on an entire top surface of the copper core; a dielectric cap over the metal cap, on any exposed portions of the liner, and on the dielectric layer; and wherein an interface between the copper core and the metal layer does not contain oxygen.

A third aspect of the present invention is a deposition tool comprising: a load/unload chamber; a mechanism for transferring a substrate between the load/unload chamber and a deposition chamber, the deposition chamber connected to the load/unload chamber by a port; and wherein the deposition chamber is (i) configured to selectively form a metal layer on copper by chemical vapor deposition or by atomic layer deposition and (ii) is configured to form a dielectric layer by chemical vapor deposition.

A fourth aspect of the present invention is a deposition tool, comprising: a load/unload chamber, first and second deposition chambers connected to the load/unload chamber by respective ports; a mechanism for transferring a substrate between the first deposition chamber, the second deposition chamber and the load/unload chamber; wherein the first deposition chamber is configured to selectively form a metal layer on copper by chemical vapor deposition or by atomic layer deposition; and wherein the second deposition chamber is configured to form a dielectric layer by chemical vapor deposition.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIGS. 3A through 3D are cross-sections illustrating fabrication of in-situ metal/dielectric caps over the wires of FIG. 1 according to a second embodiment of the present invention;

FIGS. 4A through 4D are cross-sections illustrating variations to the first and second embodiments of the present invention;

FIGS. 5A through 5C and 5E-5F are cross-sections illustrating fabrication of in-situ metal/dielectric caps over the wires of FIG. 1 according to a fourth embodiment of the present invention;

FIGS. 6A and 6B are cross-sections illustrating variations to the third and fourth embodiments of the present invention;

FIGS. 7A through 7D illustrate a first set of tools for forming in-situ interconnects according to the first and third embodiments of the present invention.

DETAILED DESCRIPTION

Dielectric capping layers are used in copper interconnect technology to prevent corrosion of the copper wires by sealing the top surfaces of the wires between wiring levels. However, as wire dimensions decrease, current density increases and the "weakest" site for resisting electromigration failure is the capping layer copper interface. Metal capping layers improve electromigration performance but at the cost of increased copper corrosion fails. The inventors have newly discovered that the increased corrosion failure rates are due to oxygen at the metal cap/copper interface caused by oxygen diffusion through the metal cap.

The present invention resolves these problems by combining a metal capping layer on the surface of the copper for improved electromigration performance and a dielectric capping layer as an oxygen barrier on the metal capping layer and the interlevel dielectric the wires are embedded in. However, best results are obtained when both the metal and dielectric capping layers are formed in a non-oxygen atmosphere and between depositing the metal capping layer and the dielectric capping layer, the copper interconnect structure (with the metal capping layer in place) is not exposed to oxygen (or other copper corroding material).

FIGS. 1A through 1E are cross-sections illustrating fabrication of interconnect wires according to embodiments of the present invention. FIGS. 1A through 1E illustrate fabrication of damascene and dual-damascene wires.

A damascene process is one in which wire trenches or via openings are defined by a patterned hardmask layer and etched into an underlying interlevel dielectric (ILD) layer, an electrical conductor of sufficient thickness to fill the trenches is deposited, and a chemical-mechanical-polish (CMP) process is performed to remove excess conductor and the hardmask layer and to make the surface of the conductor co-planar with the surface of the dielectric layer to form damascene wires (or damascene vias). When only a trench and a wire (or a via opening and a via) is formed the process is called single-damascene. The pattern in the hardmask is photolithographically defined.

A dual dual-damascene process is one in which wire trenches are defined by a patterned hardmask layer and etched partway into an underlying ILD layer followed by formation of vias inside the trenches through the remaining thickness of the ILD layer in cross-sectional view. All via openings are intersected by integral wire trenches above and by a wire trench below, but not all trenches need intersect a via opening. Thereafter the process is the same as for single-damascene wires.

Figure 1A:
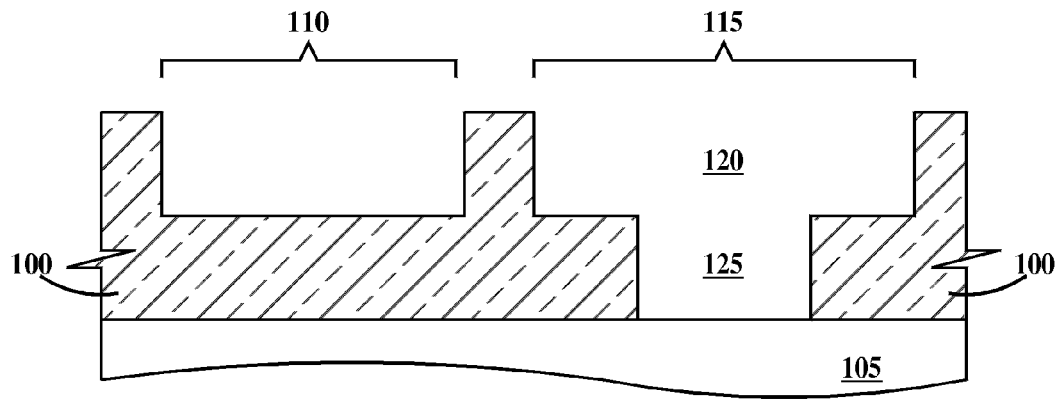
FIGS. 1A through 1E are cross-sections illustrating fabrication of interconnect wires according to embodiments of the present invention.

In FIG. 1A, an ILD layer 100 is formed on a substrate 105. In semiconductor processing, substrate 105 is called a wafer and is a flat circular disk having, for example, diameters of 100, 125, 200 or 300 mm and thicknesses of about several hundred to about a thousand microns. Substrate 105 includes a semiconductor (e.g., silicon) layer on/and in which various dielectric and conductive layers have been built up to form devices such as transistors. Substrate 105 may also include other wiring levels having metal contacts, damascene wires and/or dual damascene wires formed in respective ILD layers. A first trench 110 and a second trench 115 are formed in ILD layer 100. Trench 110 is where a damascene wire will be formed. Trench 115 is where a dual-damascene wire will be formed. Trench 115 includes a wire opening 120 open to a via opening 125. Substrate 105 is exposed in the bottom of via opening 125. While first trench 110 is not open to substrate, in some applications, notably first wiring levels that contain only damascene wires, trench 110 will be open to substrate 105 and subsequently fabricated wires physically and electrically contact metal stud contacts and/Qr portions of devices such as field effect transistors, bipolar transistors, diodes, resistors, capacitors and other semiconductor devices.

In one example, ILD layer 100 comprises a porous or nonporous silicon dioxide ($SiO_2$), fluorinated $SiO_2$ (FSG) or a low K (dielectric constant) material, examples of which include but are not limited to hydrogen silsesquioxane polymer (HSQ), methyl silsesquioxane polymer (MSQ), SiLK™ (polyphenylene oligomer) manufactured by Dow Chemical, Midland, Tex., Black Diamond™ (methyl doped silica or $SiO_x(CH_3)_y$, or $SiC_xO_yH_y$ or SiOCH) manufactured by Applied Materials, Santa Clara, Calif., organosilicate glass (SiCOH), and porous SiCOH. A low K dielectric material has a relative permittivity of about 2.4 or less. In one example, ILD layer 100 is between about 300 nm and about 700 nm thick.

Figure 1B:
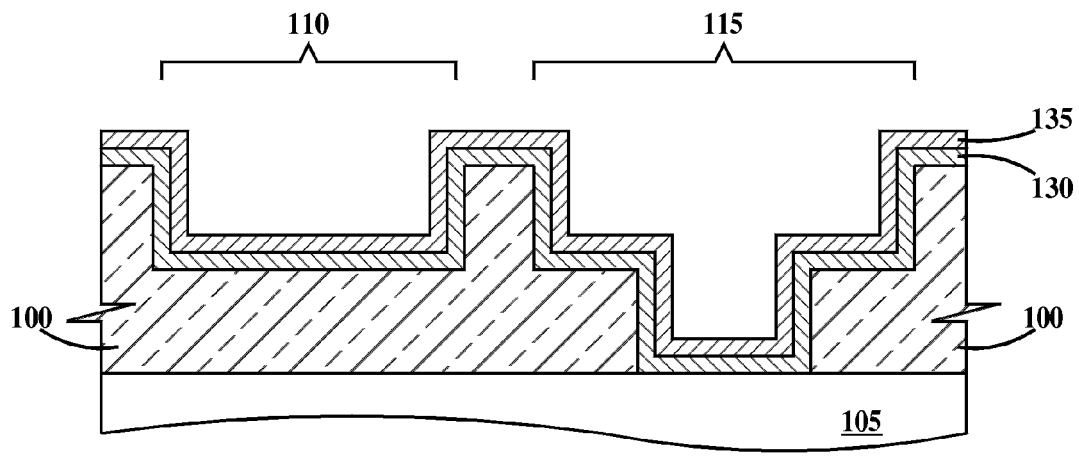

In FIG. 1B, a first liner layer 130 is formed on all exposed surfaces of ILD 100 and substrate 105. A second liner layer 135 is formed on first liner layer 130. In one example, first liner layer 130 comprises a layer of tantalum nitride (TaN) and second liner layer 135 comprises tantalum (Ta). In one example, first liner layer 130 comprises a layer of titanium nitride (TiN) and second liner layer 135 comprises titanium (Ti). In one example, first liner layer 130 comprises a layer of tungsten nitride (WN) and second liner layer 135 comprises tungsten (W). In one example, first liner layer 130 comprises a layer of ruthenium nitride (RuN) and second liner layer 135 comprises ruthenium (Ru).

Figure 1C:
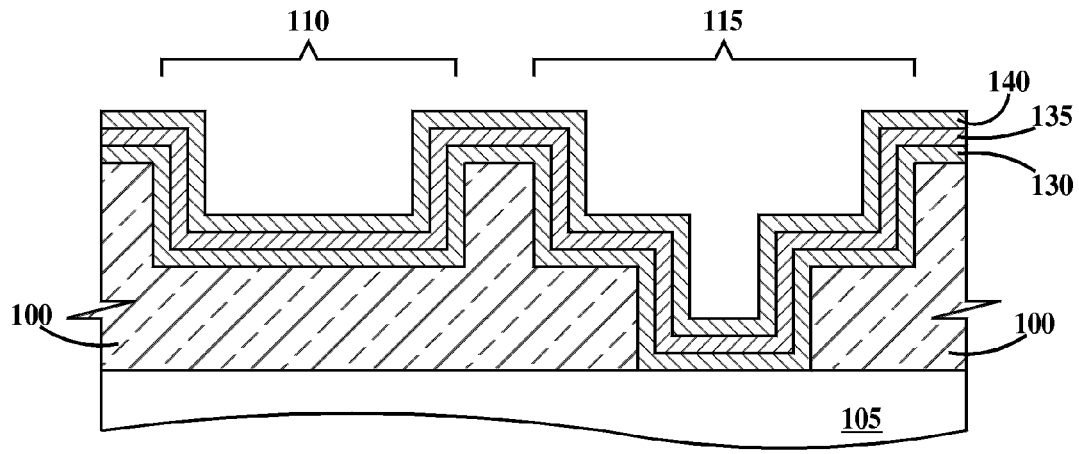
Figure 1D:
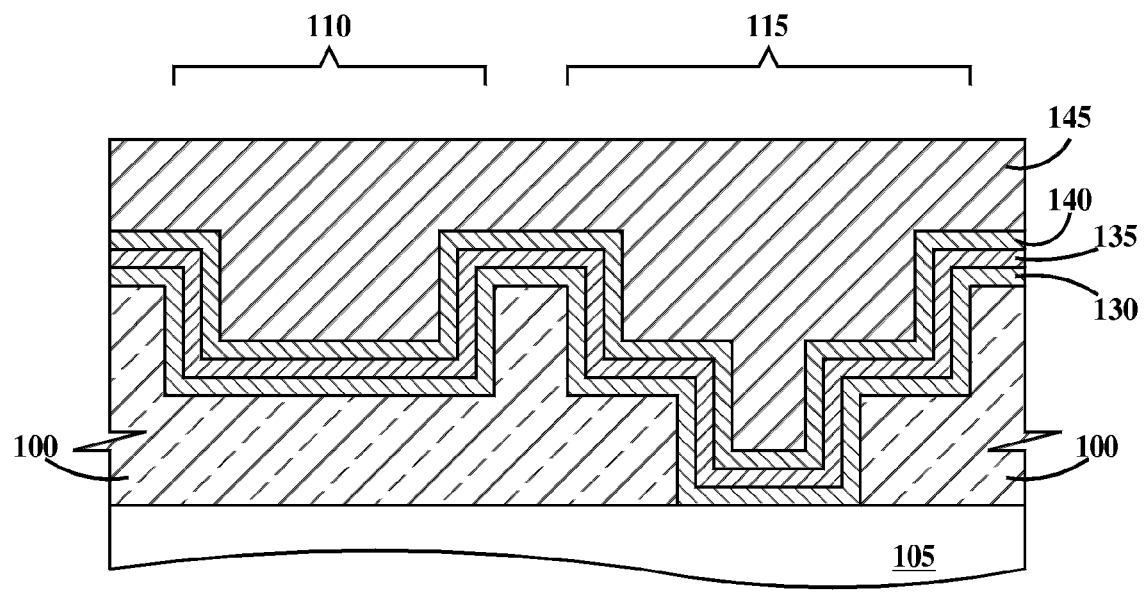

In FIG. 1C, a copper seed layer 140 is formed on second liner layer 135. In one example, copper seed layer 140 may be formed, for example, by evaporation or sputter deposition. In FIG. 1D, a copper layer 145 is formed on copper seed layer 140. In one example, copper layer 145 is formed by electroplating.

Figure 1E:
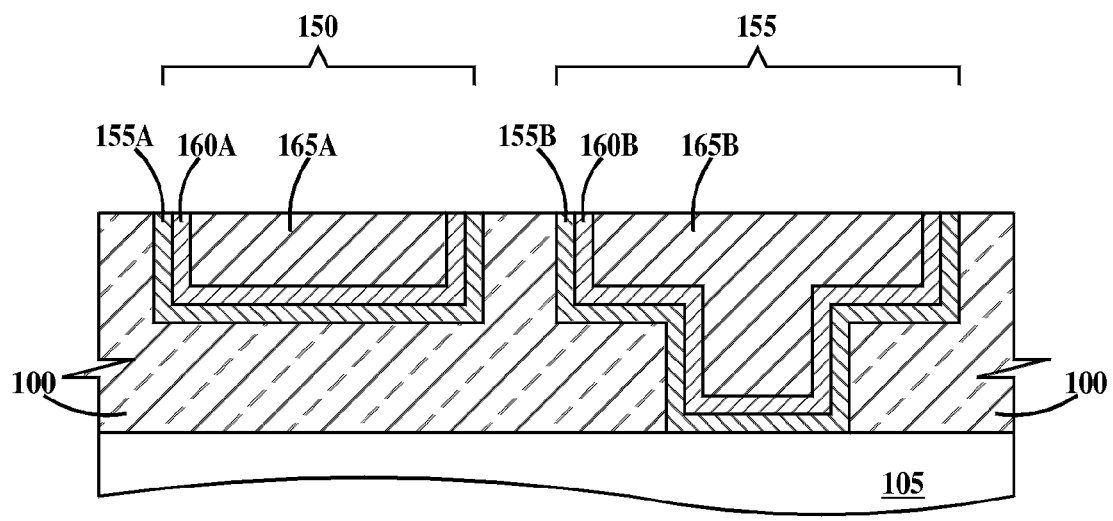

In FIG. 1E, a CMP has been performed to form a damascene wire 150 in trench 110 (see FIG. 1D) and a dual damascene wire 155 in trench 115 (see FIG. 1D). Wire 110 includes a first liner 155A (formed from first liner layer 130 of FIG. 1D), a second liner 160A (formed from second liner layer 135 of FIG. 1D) and a copper core conductor 165A formed from copper seed layer 140 and copper layer 145 of FIG. 1D). Wire 115 includes a first liner 155B (formed from first liner layer 130 of FIG. 1D), a second liner 160B (formed from second liner layer 135 of FIG. 1D) and a copper core conductor 165B formed from copper seed layer 140 and copper layer 145 of FIG. 1D). After CMP, the top surfaces of wires 150 and 155 are substantially coplanar with a top surface of ILD 100.

Figure 2A:
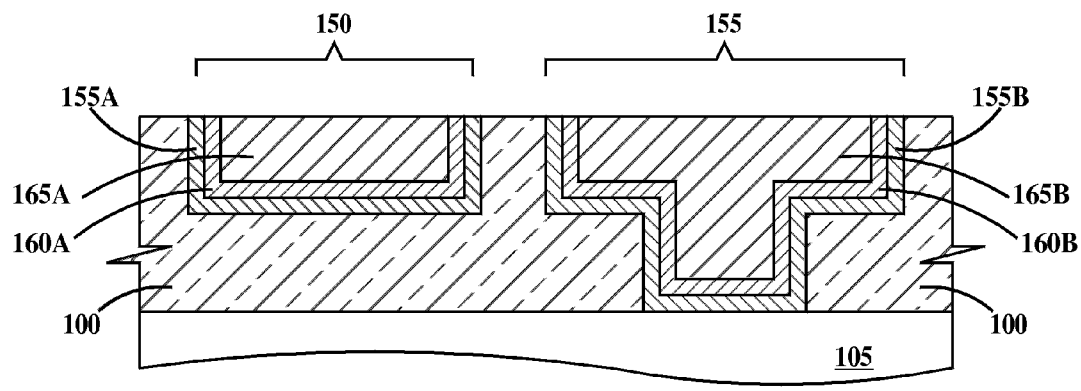
FIGS. 2A through 2C are cross-sections illustrating fabrication of in-situ metal/dielectric caps over the wires of FIG. 1 according to a first embodiment of the present invention.
Figure 2B:
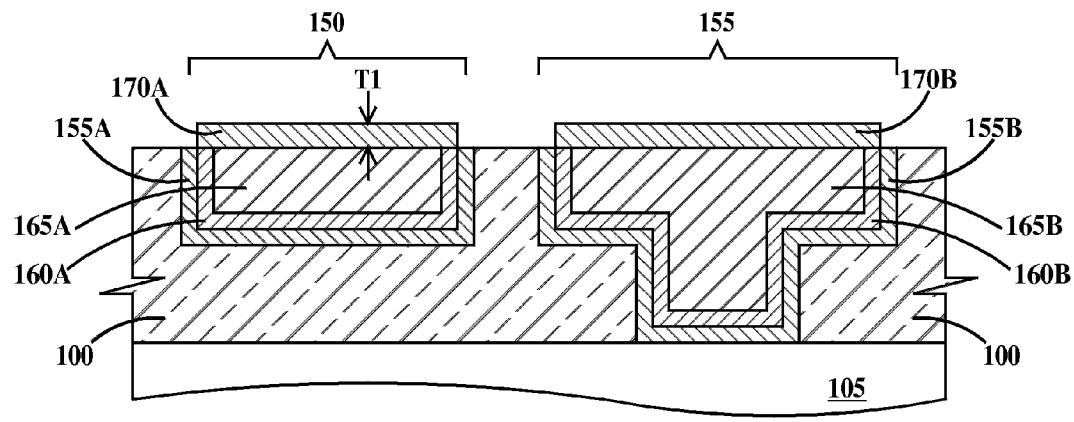
Figure 2C:
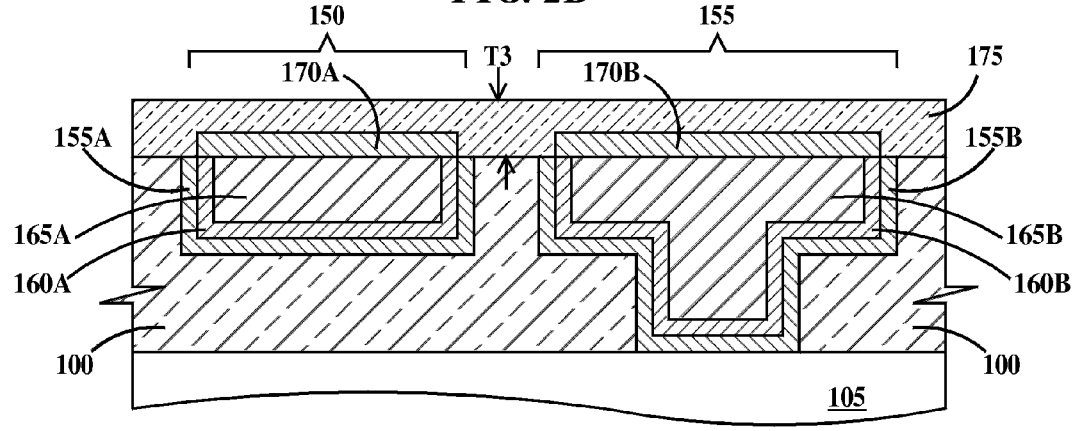

FIGS. 2A through 2C are cross-sections illustrating fabrication of in-situ metal/dielectric caps over the wires of FIG. 1 according to a first embodiment of the present invention. FIG. 2A is the same as FIG. 1F. However, an optional clean (wet or reactive ion etch (RIE) may be performed prior to loading the wafer (substrate 105) into the chamber that will form the metal capping layer illustrated in FIG. 2B.

In FIG. 2B, a selective metal cap 170A is formed on wire 150 and a selective metal cap 170B is simultaneously formed on the top surface of wire 155. The entire top surfaces of copper core 165A or copper core 165B are covered by respective metal caps 170A and 170B. Metal caps 170A and 170B have a thickness T1. In one example T1 is between about 1 nm and about 50 nm. In one example metal caps 170A and 170B consist of one or more metals. In one example, metal caps 170A and 170B are a metal selected from the group consisting of Ruthenium (Ru), cobalt (Co), Ti, palladium (Pd), nickel (Ni), gold (Au), iridium (Ir), manganese (Mn), W and combinations thereof, with Ru, Mn, Co and combinations thereof preferred and Ru most preferred.

Metal caps 170A and 170B are formed by selective deposition of the metal on Cu. The selective deposition techniques include chemical vapor deposition (CVD) and atomic layer deposition (ALD). It is a feature of the present invention that metal caps 170A and 170B be formed in a non-oxygen (i.e., no free O, $O_2$, or $O_3$) atmosphere. Selective processes according to embodiments of the present invention involve self-complementary materials and are self-limiting depositions of a metal from a reactive vapor phase compound of the metal exclusively on exposed Cu. In one example, Ru may be selectively deposited on Cu using triruthenium dodecacarbonyl ($Ru_3(CO)_{12}$) precursor in a CVD reaction. Such a processes is described in United States Patent Publication 2008/0315429 by McFeely et al. and is hereby incorporated by reference in its entirety. Co may be selectively deposited on Cu using dicarbonyl (h5-2,4-cycopentadien-1-yl)Co precursor in a CVD reaction.

In FIG. 2C, a dielectric cap 175 is formed on metal caps 170A and 170B, any exposed regions of wires 150 and 155 (e.g., exposed liners) and on ILD 100. Dielectric cap has a thickness T2. In one example, T2 is between about 5 nm and about 100 nm. It is a feature of the present invention that the formation of dielectric cap 175 is performed in a non-oxygen atmosphere and that the structure of FIG. 2B not exposed to oxygen before dielectric cap 175 is formed. Dielectric cap 175 is formed by blanket or non-selective CVD. In one example, dielectric cap 175 is silicon nitride ($Si_3N_4$) or (SiN), silicon carbide (SiC) or amorphous silicon carbonitride ($SiC_y$, $N_x$:H)). It is a feature of the present invention that dielectric cap 175 be formed in a non-oxygen (i.e., no free O, $O_2$, or $O_3$) atmosphere. The CVD reactants may contain bound oxygen atoms that are released as bound oxygen atoms (e.g., CO, $CO_2$) by the deposition reaction. It is preferred that dielectric cap 175 not be formed from a material containing oxygen. The metal cap 170A and 170B to core conductor 165A and 165B interfaces do not contain oxygen.

Figure 3A:
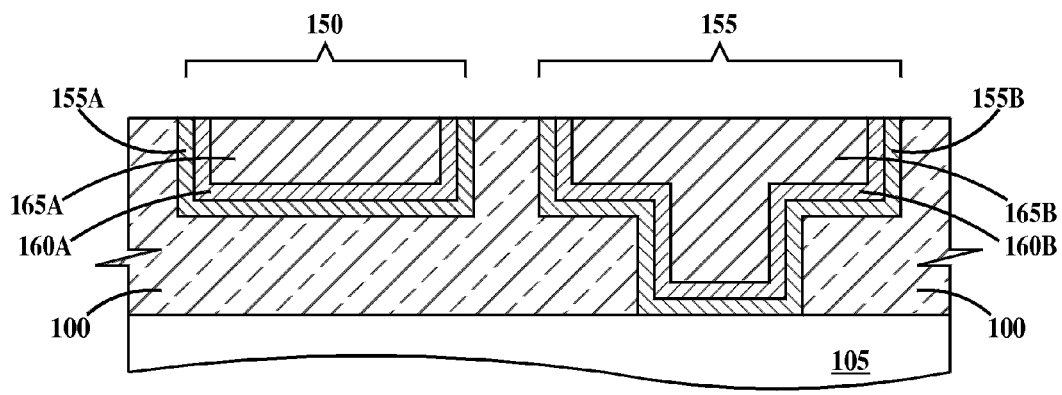
Figure 3B:
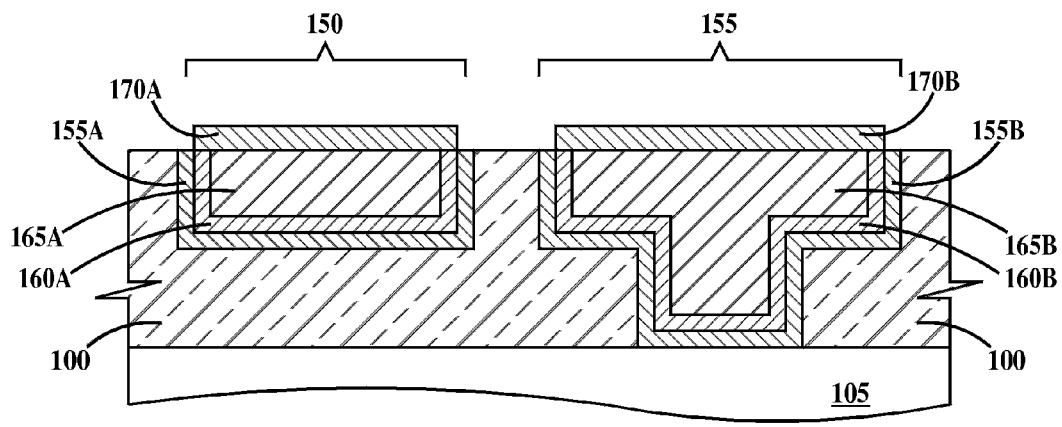

FIGS. 3A through 3D are cross-sections illustrating fabrication of in-situ metal/dielectric caps over the wires of FIG. 1 according to a second embodiment of the present invention. The second embodiment differs from the first, only in that an additional step is performed between the step illustrated in FIG. 2B and the step illustrated in FIG. 2C. FIGS. 3A and 3B therefore are the same as FIGS. 2A and 2B. An optional clean (wet or reactive ion etch (RIE)) may be performed prior to loading the wafer (substrate 105) into the chamber that will form the metal capping layer illustrated in FIG. 3B.

Figure 3C:
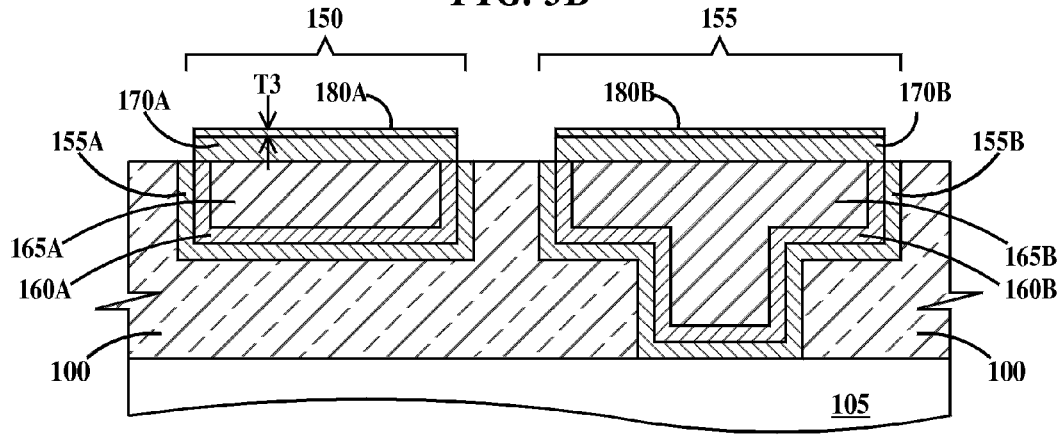

In FIG. 3C, alloy caps 180A and 180B are simultaneously formed on respective metal caps 170A and 170B. Alloy caps 180A and 180B have a thickness T3. In one example, T3 is between about 0.5 nm and about 5 nm. Exemplary materials for alloy caps 180A and 180B include, but are not limited to RuP, RuB, RuW, RuPW, RuPB, RuBW, RUPBW, CoP, CoB, CoW, CoPW, CoPB, CoBW, CoPBW, MnP, MnB, MnW, MnPW, MnPB, MnBW, and MnPBW.

Alloy caps 180A and 180B are formed by selective deposition on metal caps 170A and 170B respectively. The selective deposition technique include chemical vapor CVD and ALD. It is a feature of the present invention that alloy caps 180A and 180B be formed in a non-oxygen (i.e., no free O, $O_2$, or $O_3$) atmosphere. It is a feature of the present invention that the structure of FIG. 3B not be exposed to oxygen before alloy caps 180A and 180B are formed.

FIG. 3D is similar to FIG. 2C except for the presence of alloy caps 180A and 180B. It is a feature of the present invention that dielectric cap 175 be formed in a non-oxygen (i.e., no free O, $O_2$, or $O_3$) atmosphere. Dielectric cap 175 is formed on alloy caps 180A and 180B, any exposed regions of metal caps 170A and 170B, any exposed regions of liners 155A, 155B, 160A and 160B and ILD 100. It is a feature of the present invention that the structure of FIG. 3C not be exposed to oxygen before dielectric cap 175 is formed. The metal cap 170A and 170B to core conductor 165A and 165B interfaces do not contain oxygen.

FIGS. 4A through 4D are cross-sections illustrating variations to the first and second embodiments of the present invention. Returning to FIG. 2B or 3B, the edges of metal caps 170A and 170B are aligned to respective liner 155A/160A and liner 155B/160B interfaces. This is a first variation. In FIG. 4A, a metal cap 170 is aligned to the liner 160/core conductor interface. This is a second variation. In FIG. 4B, metal cap 170 overlaps liner 160, but not liner 155. This is a third variation. In FIG. 4C, metal cap 170 overlaps liners 160 and 155 but not ILD 100. This is a fourth variation. In FIG. 4D, metal cap 170 is aligned to the liner 155/ILD 100 interface. In a fifth variation, metal cap layer 170 overlaps ILD 100 in a region immediately adjacent to liner 155.

Figure 5A:
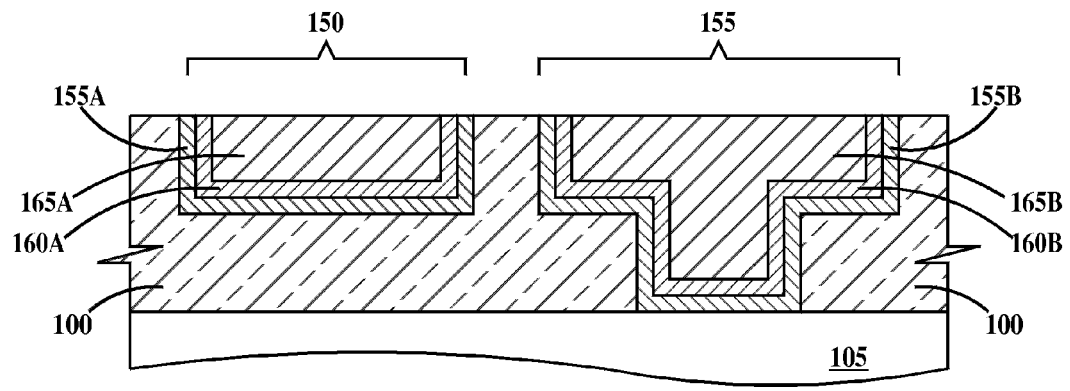
FIGS. 5A through 5D are cross-sections illustrating fabrication of in-situ metal/dielectric caps over the wires of FIG. 1 according to a third embodiment of the present invention.
Figure 5B:
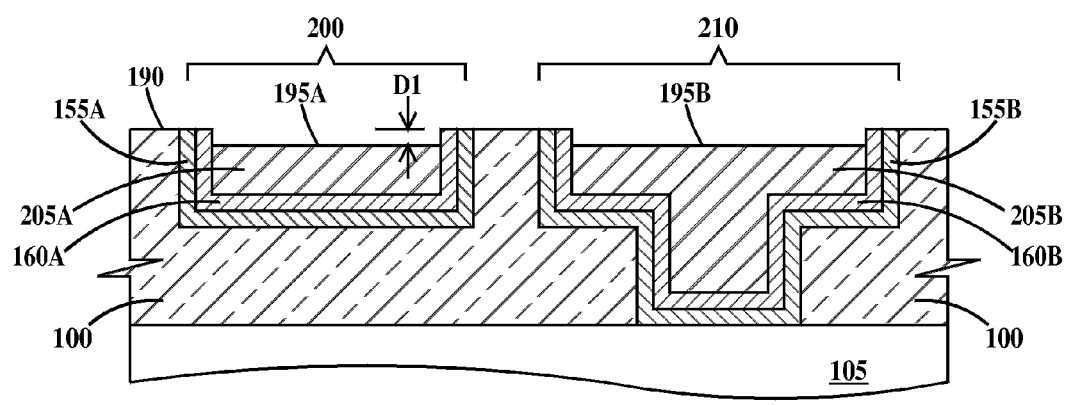

FIGS. 5A through 5D are cross-sections illustrating fabrication of in-situ metal/dielectric caps over the wires of FIG. 1 according to a third embodiment of the present invention. FIG. 5A is the same as FIG. 1E. In FIG. 5B, a copper recess etch is performed on core conductors 185A and 185B of FIG. 5A to form recessed core conductors 205A and 205B of respective wires 200 and 210. Respective top surfaces 195A and 195B of core conductors 205A and 205B are recessed below top surface 190 of ILD 100 a distance D1. In one example, D1 is between about 10 and about 50 nm, preferably between about 20 and 35 nm.

Figure 5C:
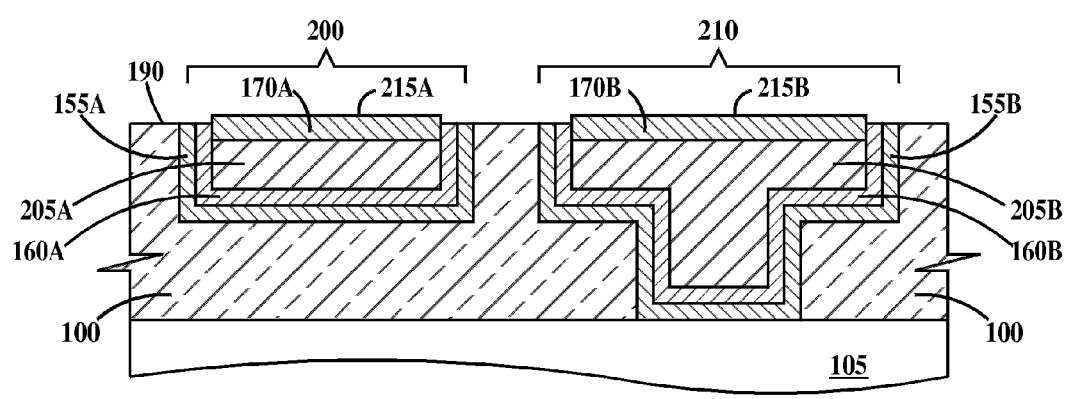

In FIG. 5C, metals caps 170A and 170B are formed on respective core conductors 205A and 205B. In the example of FIG. 5C, respective top surfaces 215A and 215B of metal caps 170A and 170B extend above top surface 190 of ILD 100. Methods for forming and materials for metal caps 170A and 170B have been discussed supra. No portions of core conductors 205A or 205B are exposed.

Figure 5D:
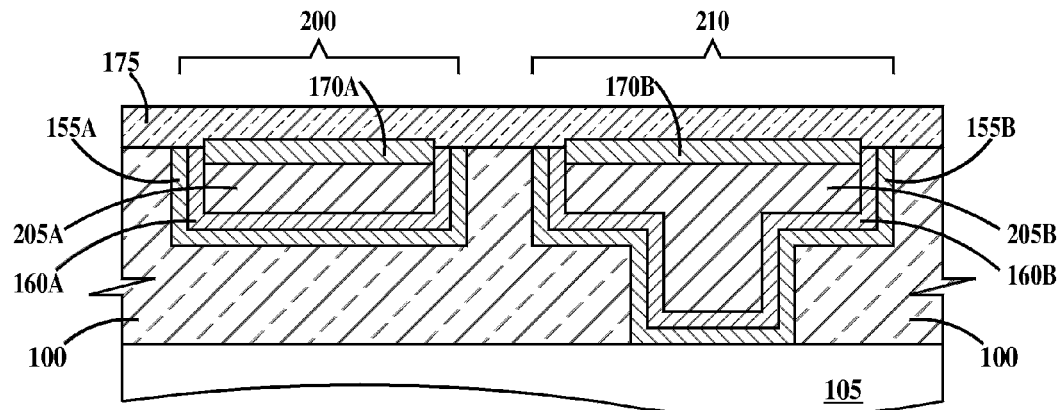

In FIG. 5D, dielectric cap 175 is formed on metal caps 170A and 170B, any exposed regions of wires 200 and 210 (e.g., exposed liners) and on ILD 100. It is a feature of the present invention that dielectric cap 175 be formed in a non-oxygen (i.e., no free O, $O_2$, or $O_3$) atmosphere. It is a feature of the present invention that the structure of FIG. 5C is not exposed to oxygen before dielectric cap 175 is formed. The metal cap 170A and 170B to core conductor 165A and 165B interfaces do not contain oxygen. It is preferred that dielectric cap 175 not be formed from a material containing oxygen.

Figure 5E:
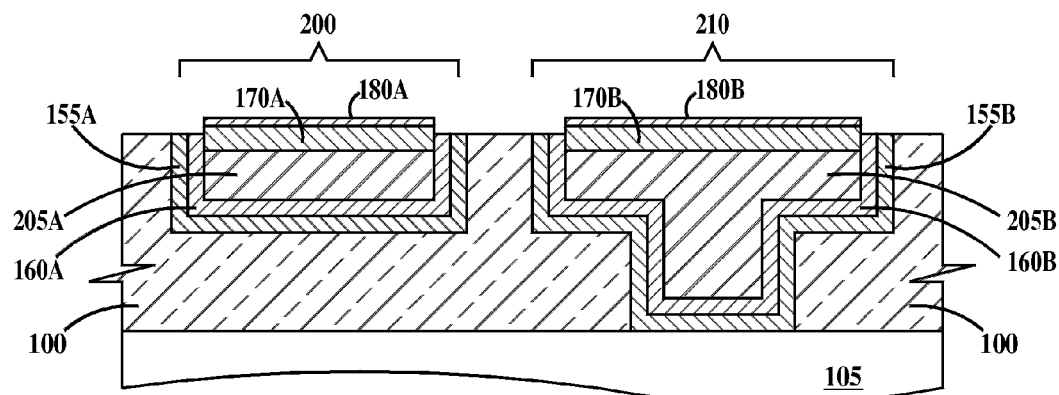
Figure 5F:
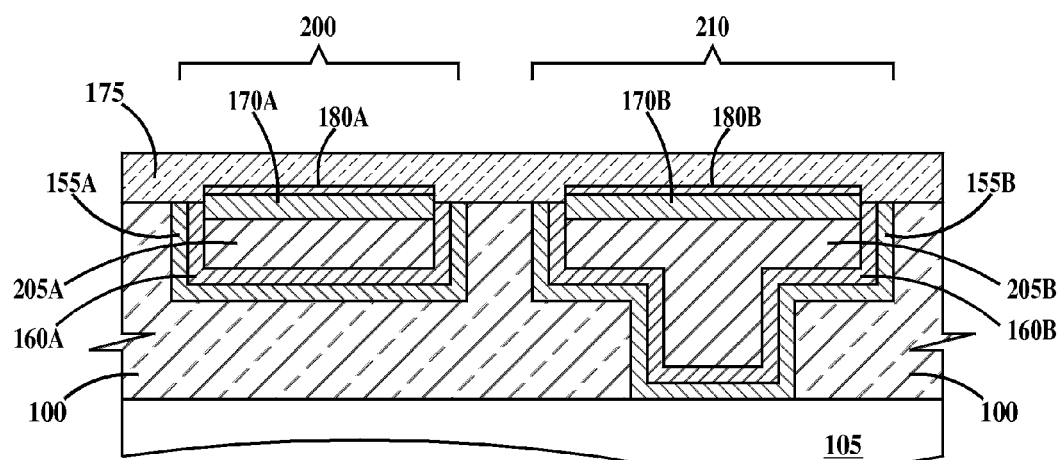

FIGS. 5A through 5C and 5E-5F are cross-sections illustrating fabrication of in-situ metal/dielectric caps over the wires of FIG. 1 according to a fourth embodiment of the present invention. FIGS. 5A through 5C have been discussed supra. In FIG. 5E alloy caps 180A and 180B are formed on respective metal cap 170A and 170B. Methods for forming and materials for alloy caps 180A and 180B have been discussed supra. It is a feature of the present invention that alloy caps 180A and 180B be formed in a non-oxygen (i.e., no free O, $O_2$, or $O_3$) atmosphere. It is a feature of the present invention that the structure of FIG. 5C not be exposed to oxygen before alloy caps 180A and 180B are formed. In FIG. 5F, dielectric cap 175 is formed on alloy caps 180A and 180B, any exposed regions of alloy caps 170A and 170B, any exposed regions of wires 150 and 155 (e.g., exposed liners) and on ILD 100. It is a feature of the present invention that dielectric cap 175 be formed in a non-oxygen (i.e., no free O, $O_2$, or $O_3$) atmosphere. It is a feature of the present invention that the structure of FIG. 5E not be exposed to oxygen before dielectric cap 175 is formed. The metal cap 170A and 170B to core conductor 165A and 165B interfaces do not contain oxygen.

FIGS. 6A and 6B are cross-sections illustrating variations to the third and fourth embodiments of the present invention. Returning to FIG. 5C, respective top surfaces 215A and 215B of metal caps 170A and 170B extend above top surface 190 of ILD 100. This is a first variation. In FIG. 6A, a top surface 215 off a metal cap 170 is coplanar with top surface 190 of ILD 100. This is a second variation. In FIG. 6B, top surface 215 of metal cap 170 extends above top surface 190 of ILD 100. This is a third variation.

FIGS. 7A through 7D illustrate a first set of tools for forming in-situ interconnects according to the first and third embodiments of the present invention. In FIGS. 7A through 7D it should be understood that a CVD chamber performs a CVD deposition process and an ALD chamber performs an ALD deposition process. An ALD/CVD chamber is capable of selectively performing either an ALD deposition process or a CVD deposition process. Further, CVD deposition of dielectric layers (dielectric caps) is a blanket or non-selective deposition.

In FIG. 7A, a deposition tool 300 includes a load/unload chamber 305A, a CVD chamber 310 and a CVD chamber 315. Load/unload chamber 305A is capable of being purged with a non-oxygen containing and inert gas, for example nitrogen (N$_2$). Load/unload chamber 305A includes a mechanism for loading and unloading wafers, for transferring wafers between chambers 305A, 310 and 315 of tool 300. Chambers 310 and 315 are connected to load/unload chamber 305A by ports, which can be closed during deposition. CVD chamber 310 is configured to deposit metal caps and CVD chamber 315 is configured to deposit dielectric caps. In use, the following steps are performed: (1) a wafer(s) is loaded into load/unload chamber 305A and load/unload chamber 305A purged with inert gas, (2) the wafer(s) is transferred into CVD chamber 310 where metal caps are formed and then CVD chamber 310 is purged with an inert gas, (3) the wafer(s) is transferred from CVD chamber 310, through load/unload chamber 305A (which is essentially free of oxygen) to CVD chamber 315, without exposure to air or oxygen, where a dielectric cap is deposited and then CVD chamber 315 is purged with inert gas, (4) the wafer(s) is transferred from CVD chamber 315 to load/unload chamber 305A (which is essentially free of oxygen), and (5) the wafer(s) is unloaded from load/unload chamber 305A. All chambers are sealed except when the wafer(s) is being transferred, loaded or unloaded.

In FIG. 7B, a deposition tool 320 includes load/unload chamber 305A, an ALD chamber 325 and CVD chamber 315. ALD chamber 325 is configured to deposit metal caps and CVD chamber 315 is configured to deposit dielectric caps. Load/unload chamber 305A includes a mechanism for loading and unloading wafers, for transferring wafers between chambers 305A, 315 and 325 of tool 320. Chambers 315 and 325 are connected to load/unload chamber 305A by ports, which can be closed during deposition. In use, the following steps are performed: (1) a wafer(s) is loaded into load/unload chamber 305A and load/unload chamber 305A purged with inert gas, (2) the wafer(s) is transferred into ALD chamber 325 where metal caps are formed and then ALD chamber 325 is purged with an inert gas, (3) the wafer(s) is transferred from ALD chamber 325, through the load/unload chamber 305A (which is essentially free of oxygen) to CVD chamber 315, without exposure to air or oxygen, where a dielectric cap is deposited and then CVD chamber 315 is purged with an inert gas, (4) the wafer(s) is transferred from CVD chamber 315 to load/unload chamber 305A (which is essentially free of oxygen), and (5) the wafer(s) is unloaded from load/unload chamber 305A. All chambers are sealed except when the wafer(s) is being transferred, loaded or unloaded.

In FIG. 7C, a deposition tool 330 includes load/unload chamber 305B, and a CVD chamber 335 configured for CVD deposition of metals and dielectrics. Load/unload chamber 305B includes a mechanism for loading and unloading wafers and for transferring wafers between chambers 305B and 335 of tool 330. Chamber 335 is connected to load/unload chamber 305B by a port, which can be closed during deposition. In use, the following steps are performed: (1) a wafer(s) is loaded into load/unload chamber 305B and load/unload chamber 305 purged with inert gas, (2) the wafer(s) is transferred into CVD chamber 335 where metal caps are formed by CVD, then a dielectric cap is formed by CVD, and then CVD chamber 335 is purged with inert gas, (3) the wafer(s) is transferred from CVD chamber 335 to load/unload chamber 305B (which is essentially free of oxygen), and (4) the wafer(s) is unloaded from load/unload chamber 305B. All chambers are sealed except when the wafer(s) is being transferred, loaded or unloaded.

In FIG. 7D, a deposition tool 340 includes load/unload chamber 305, and an ALD/CVD chamber 345 configured for ALD deposition of metals and CVD deposition of dielectrics. Load/unload chamber 305B includes a mechanism for loading and unloading wafers and for transferring wafers between chambers 305A and 345 of tool 340. Chamber 345 is connected to load/unload chamber 305B by a port, which can be closed during deposition. In use, the following steps are performed: (1) a wafer(s) is loaded into load/unload chamber 305B and load/unload chamber 305B is purged with inert gas, (2) the wafer(s) is transferred into ALD/CVD chamber 345 where metal caps are formed by ALD, then a dielectric cap is formed by CVD and then ALD/CVD chamber 345 is purged with an inert gas, (3) the wafer(s) is transferred from ALD/CVD chamber 345 to load/unload chamber 305B (which is essentially free of oxygen), and (4) the wafer(s) is unloaded from load/unload chamber 305B. All chambers are sealed except when the wafer(s) is being transferred, loaded or unloaded.

Figure 8A:
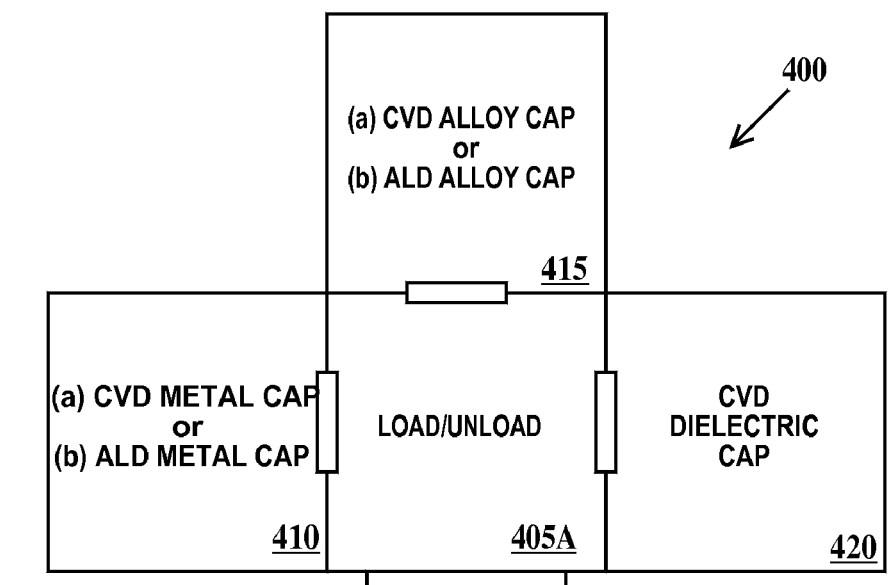
FIGS. 8A through 8C illustrate a second set of tools for forming in-situ interconnects according to the second and fourth embodiments of the present invention.
Figure 8B:
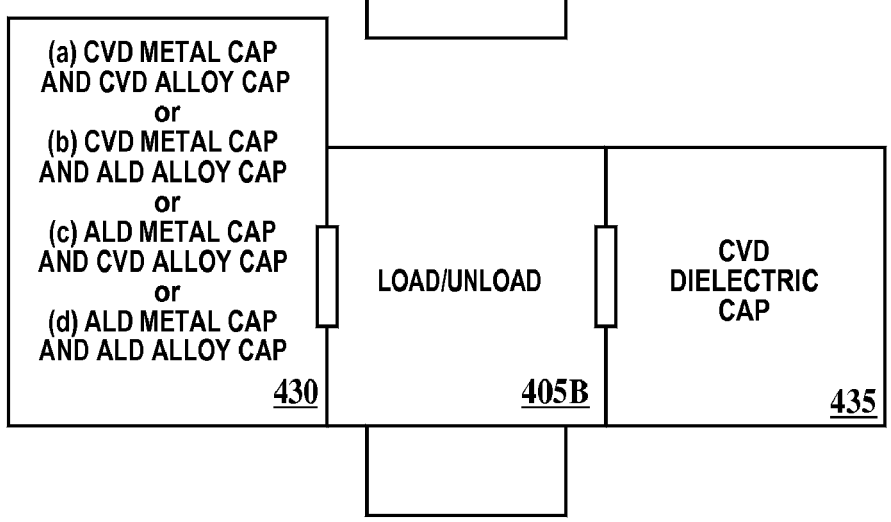
Figure 8C:
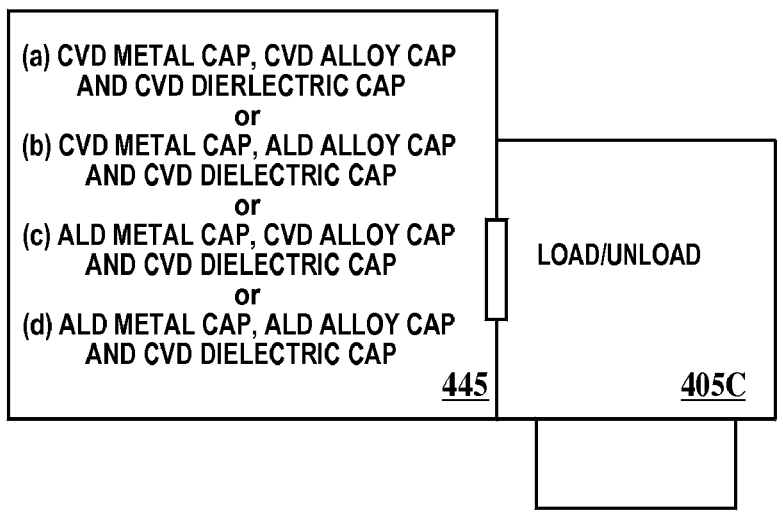

FIGS. 8A through 8C illustrate a second set of tools for forming in-situ interconnects according to the second and fourth embodiments of the present invention. In FIGS. 8A through 8C it should be understood that a CVD chamber performs a CVD deposition process and an ALD chamber performs an ALD deposition process. An ALD/CVD chamber is capable of selectively performing either an ALD deposition process or a CVD deposition process. Further, CVD deposition of dielectric layers (dielectric caps) is a blanket or non-selective deposition.

In FIG. 8A, a deposition tool 400 includes a load/unload chamber 405A, a first chamber 410, a second chamber 415 and a third chamber 420. First chamber 410 is configured to either form metal caps by (a) CVD or (b) metal caps by ALD but not both. Second chamber is configured to form alloy caps by (a) CVD or (b) ALD but not both. Third chamber 420 is configured to form a dielectric cap by CVD. Load/unload chamber 405B includes a mechanism for loading and unloading wafers and for transferring wafers between chambers 405A, 410, 415 and 420 of tool 400. Chambers 410, 415 and 420 are connected to load/unload chamber 405A by a port, which can be closed during deposition. Load/unload chamber 405A is capable of being purged with a non-oxygen containing and inert gas, for example N$_2$. In use, the following steps are performed: (1) a wafer(s) is loaded into load/unload chamber 405A and the load/unload chamber purged with the inert gas, (2) the wafer(s) is transferred into first chamber 410 where metal caps are formed by either ALD or CVD and then first chamber 410 is purged with inert gas, (3) the wafer(s) is transferred from first chamber 410, through the load/unload chamber 405 (which is essentially free of oxygen) to second chamber 415, without exposure to air or oxygen, where alloy caps are formed by either ALD or CVD and then second chamber 415 is purged with inert gas, (4) the wafer(s) is transferred from second chamber 415, through load/unload chamber 405A (which is essentially free of oxygen) to third chamber 420, without exposure to air or oxygen, where a dielectric cap is formed by CVD and then third chamber 420 is purged with inert gas, (5) the wafer(s) is transferred from third chamber 420 to load/unload chamber 405A (which is essentially free of oxygen), and (6) the wafer(s) is unloaded from load/unload chamber 405A. All chambers are sealed except when the wafer(s) is being transferred, loaded or unloaded.

In FIG. 8B, a deposition tool 425 includes load/unload chamber 405B, a first chamber 430 and second chamber 435. Load/unload chamber 405B includes a mechanism for loading and unloading wafers, for transferring wafers between chambers 405B, 430 and 435 of tool 425. Chambers 430 and 435 are connected to load/unload chamber 405B by ports, which can be closed during deposition. First chamber 430 is configured to form (a) metal caps by CVD and alloy caps by CVD, or (b) metal caps by CVD and alloy caps by ALD, or (c) metal caps by ALD and alloy caps by CVD or (d) metal caps by ALD and alloy caps by ALD. Second chamber 435 is configured to form a dielectric cap by CVD. Load/unload chamber 405B is capable of being purged with a non-oxygen containing and inert gas, for example N$_2$. In use, the following steps are performed: (1) a wafer(s) is loaded into load/unload chamber 405B and the load/unload chamber purged with the inert gas, (2) the wafer(s) is transferred into first chamber 430 where metal caps are formed by either ALD or CVD and then alloy caps are formed by either ALD or CVD and then first chamber 435 is purged with inert gas, (3) the wafer(s) is transferred from first chamber 430, through the load/unload chamber 405 (which is essentially free of oxygen) to second chamber 435, without exposure to air or oxygen, where a dielectric cap is formed by CVD and then second chamber 435 is purged with inert gas, (4) the wafer(s) is transferred from second chamber 435 to load/unload chamber 405B (which is essentially free of oxygen), and (5) the wafer(s) is unloaded from load/unload chamber 405B. All chambers are sealed except when the wafer(s) is being transferred, loaded or unloaded.

In FIG. 8C, a deposition tool 440 includes load/unload chamber 405C, and deposition chamber 455 configured to form (a) metal caps, alloy caps and a dielectric cap by CVD, or (b) metal caps by CVD, alloy caps by ALD and a dielectric cap by CVD, or (c) metal and alloy caps by ALD and a dielectric cap by CVD, or (d) metal caps and alloy caps by ALD and a dielectric cap by CVD. Load/unload chamber 405C includes a mechanism for loading and unloading wafers and for transferring wafers between chambers 405C and 445 of tool 440. Chamber 445 is connected to load/unload chamber 405C by a port, which can be closed during deposition. In use, the following steps are performed: (1) a wafer(s) is loaded into load/unload chamber 405C and the load/unload chamber purged with the inert gas, (2) the wafer(s) is transferred into process chamber 440 where metal caps are formed by either ALD or CVD, then alloy caps are formed by either ALD or CVD, then a dielectric cap is formed by CVD and then process chamber 440 is purged with inert gas, (3) the wafer(s) is transferred from process chamber 440 to load/unload chamber 405C (which is essentially free of oxygen), and (4) the wafer(s) is unloaded from load/unload chamber 405. All chambers are sealed except when the wafer(s) is being transferred, loaded or unloaded.

Thus the embodiments of the present invention provide capping methods for copper interconnects with increased resistance to electro-migration failures and interconnect corrosion and copper interconnect structures with increased resistance to electro-migration failures and interconnect corrosion. The embodiments of the present invention also provide tools for forming copper interconnects with increased resistance to electro-migration failures and interconnect corrosion.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method comprising:
   (a) forming wire embedded in a dielectric layer on a semiconductor substrate, said wire comprising a copper core and an electrically conductive liner on sidewalls and a bottom of said copper core, a top surface of said copper core, a top surface of said electrically conductive liner and a top surface of said dielectric layer are coplanar;
   (b) forming a metal cap on an entire top surface of said copper core;
   (c) without exposing said substrate to oxygen, forming a dielectric cap on exposed surfaces of said metal cap, on all exposed surfaces of said liner, and on said top surface of said dielectric layer; and
   wherein said dielectric cap is an oxygen diffusion barrier and contains no oxygen atoms.

2. The method of claim 1, wherein:
   (b) and (c) are performed in a same chamber of a first deposition tool without removing said substrate from said chamber; or
   (b) and (c) are performed in a different chambers of a second deposition tool without removing said substrate from said tool.

3. The method of claim 1, wherein said metal cap is formed by either selective chemical vapor deposition or selective atomic layer deposition and said dielectric cap is formed by chemical vapor deposition.

4. The method of claim 1, wherein said metal cap is a metal selected from the group consisting of ruthenium, cobalt, titanium, palladium, nickel, gold, iridium, manganese and combinations thereof.

5. The method of claim 1, wherein said dielectric cap comprises silicon nitride, silicon carbide, amorphous silicon carbonitride or combinations thereof.

6. The method of claim 1, further including:
   between (b) and (c), (d) without exposing said substrate to oxygen, forming an alloy cap on said metal cap; and
   wherein (c) includes forming said dielectric cap on said alloy cap, any exposed regions of said metal cap, any exposed portions of said liner, and said dielectric layer.

7. The method of claim 6, wherein:
   (b), (c) and (d) are performed in a same chamber of a first deposition tool without removing said substrate from said chamber; or
   (b) and (d) are performed in a first chamber and (c) is performed in a third chamber of a second deposition tool; or
   (b), (d) and (c) are performed in different chambers of a third deposition tool.

8. The method of claim 6, wherein said metal cap is formed by either selective chemical vapor deposition or selective atomic layer deposition, said alloy cap is formed by either selective chemical vapor deposition or selective atomic layer deposition, and said dielectric cap is formed by chemical vapor deposition.

9. The method of claim 6, wherein said alloy cap comprises RuP, RuB, RuW, RuPW, RuPB, RuBW, RuPBW, CoP, CoB, CoW, CoPW, CoPB, CoBW, CoPBW, MnP, MnB, MnW, MnPW, MnPB, MnBW or MnPBW.

10. The method of claim 6, further including:
   between (a) and (b), recessing a top surface of said copper core below said top surface of said dielectric layer.

11. The method of claim 1, further including:
   between (a) and (b), recessing a top surface of said copper core below said top surface of said dielectric layer.

12. A structure, comprising:
   a wire embedded in a dielectric layer on a semiconductor substrate, said wire comprising a copper core and an electrically conductive liner on sidewalls and a bottom of said copper core, said copper core and said electrically conductive liner exposed at a top surface of said dielectric layer;
   a metal cap on an entire top surface of said copper core;
   a dielectric cap only over (i) said metal cap, (ii) any exposed portions of said liner, and (iii) on said top surface of said dielectric layer; and
   wherein an interface between said copper core and said metal layer does not contain oxygen.

13. The structure of claim 12, wherein said dielectric cap is an oxygen diffusion barrier.

14. The structure of claim 12, wherein (i) said metal cap is a metal selected from the group consisting of ruthenium, cobalt, titanium, palladium, nickel, gold, iridium, manganese and combinations thereof and (ii) said dielectric cap comprises silicon nitride, silicon carbide, amorphous silicon carbonitride or combinations thereof.

15. The structure of claim 12, further including:
   an alloy cap on said metal cap; and
   wherein said dielectric cap is formed on said alloy cap, any exposed regions of said metal cap, any exposed portions of said liner, and said dielectric layer.

16. The structure of claim 15, wherein said alloy cap comprises RuP, RuB, RuW, RuPW, RuPB, RuBW, RuPBW, CoP, CoB, CoW, CoPW, CoPB, CoBW, CoPBW, MnP, MnB, MnW, MnPW, MnPB, MnBW or MnPBW.

17. The structure of claim 15, wherein a top surface of said copper core and said electrically conductive liner are coplanar with said top surface of said dielectric layer.

18. The structure of claim 15, wherein a top surface said electrically conductive liner is coplanar with said top surface of said dielectric layer and a top surface of said copper core is recessed below said top surface of said dielectric layer.

19. The structure of claim 12, wherein a top surface of said copper core, top edges of said electrically conductive liner on said sidewalls of said copper core and said top surface of said dielectric layer are coplanar.

20. The structure of claim 12, wherein a top surface said electrically conductive liner is coplanar with said top surface of said dielectric layer and a top surface of said copper core is recessed below said top surface of said dielectric layer.

21. The method of claim 1, wherein, after said forming said metal cap said top surface of said wire remains coplanar with said top surface of said dielectric layer.

22. The method of claim 1, wherein said metal cap is a single layer of metal selected from the group consisting of ruthenium, cobalt, titanium, palladium, nickel, gold, iridium, manganese and combinations thereof.

23. The method of claim 1, wherein said capping layer extends over a perimeter region of said electrically conductive liner.

24. The method of claim 1, wherein electrically conductive liner comprise a first liner on said sidewalls and bottom of said copper core and a second liner on said first liner, said capping layer extend completely over said first liner.

25. The method of claim 12, wherein said capping layer extends over a perimeter region of said electrically conductive liner.

26. The method of claim 12, wherein electrically conductive liner comprise a first liner on said sidewalls and bottom of said copper core and a second liner on said first liner, said capping layer extend completely over said first liner.

* * * * *